(12) United States Patent
Al-Maaitah et al.

(10) Patent No.: US 10,436,182 B2
(45) Date of Patent: Oct. 8, 2019

(54) SYSTEM FOR COLLECTING RADIANT ENERGY WITH A NON-IMAGING SOLAR CONCENTRATOR

(71) Applicants: Ayman Adnan S. Al-Maaitah, Amman (JO); Adnan Ayman Al-Maaitah, Amman (JO)

(72) Inventors: Ayman Adnan S. Al-Maaitah, Amman (JO); Adnan Ayman Al-Maaitah, Amman (JO)

( * ) Notice: Subject to any disclaimer, the term of this patent is extended or adjusted under 35 U.S.C. 154(b) by 10 days.

(21) Appl. No.: 15/796,030

(22) Filed: Oct. 27, 2017

(65) Prior Publication Data

US 2019/0024642 A1     Jan. 24, 2019

Related U.S. Application Data

(60) Provisional application No. 62/535,784, filed on Jul. 21, 2017.

(51) Int. Cl.
    *F03G 6/06*      (2006.01)
    *F24S 23/75*      (2018.01)
    (Continued)

(52) U.S. Cl.
    CPC ............. *F03G 6/065* (2013.01); *F03G 6/068* (2013.01); *F24S 10/70* (2018.05); *F24S 20/20* (2018.05);
    (Continued)

(58) Field of Classification Search
    CPC ..... F03G 6/065; F03G 6/068; H01L 31/0547;
F24S 70/60; F24S 10/70; F24S 30/455; F24S 23/70; F24S 2023/878; F24S 2030/11; F24S 80/30; F24S 2023/84; F24S 2023/833; F24S 2020/18; F24S 2023/876; Y02E 10/52; Y02E 10/40
(Continued)

(56) References Cited

U.S. PATENT DOCUMENTS

| | | | | |
|---|---|---|---|---|
| 4,161,657 A | * | 7/1979 | Shaffer, Jr. | ............. F02B 43/08 136/248 |
| 4,716,258 A | * | 12/1987 | Murtha | ............... H01L 31/0521 136/246 |

(Continued)

*Primary Examiner* — Hoang M Nguyen
(74) *Attorney, Agent, or Firm* — Heena N. Kampani; Law Office of Heena N, Kampa

(57) ABSTRACT

Implementations of a system for collecting radiant energy with a non-imaging solar concentrator are provided. In some implementations, the system may be configured to focus radiant energy striking a plurality of concentric, conical ring-like reflective elements of the non-imaging concentrator onto a receiver positioned thereunder and to rotate and/or pivot the receiver so that at least a portion thereof is always kept within the focal point (or area) of the non-imaging concentrator. Wherein the center of the focal point (or area) is fixed with respect to the ground. In some implementations, the system for collecting radiant energy with a non-imaging solar concentrator may comprise a tracking apparatus configured to support the non-imaging concentrator and position it so that the sun is normal thereto, and a piping system that is configured to transfer concentrated solar energy from the receiver to an absorbing system where the energy is finally utilized.

21 Claims, 9 Drawing Sheets

(51) Int. Cl.
*F24S 30/452* (2018.01)
*H01L 31/054* (2014.01)
*F24S 70/60* (2018.01)
*F24S 23/70* (2018.01)
*F24S 10/70* (2018.01)
*F24S 80/30* (2018.01)
*F24S 30/455* (2018.01)
*F24S 20/20* (2018.01)
*F24S 20/00* (2018.01)
*F24S 30/00* (2018.01)

(52) U.S. Cl.
CPC .............. *F24S 23/70* (2018.05); *F24S 23/75* (2018.05); *F24S 30/452* (2018.05); *F24S 30/455* (2018.05); *F24S 70/60* (2018.05); *F24S 80/30* (2018.05); *H01L 31/0547* (2014.12); *F24S 2020/18* (2018.05); *F24S 2023/833* (2018.05); *F24S 2023/84* (2018.05); *F24S 2023/876* (2018.05); *F24S 2023/878* (2018.05); *F24S 2030/11* (2018.05); *F24S 2030/137* (2018.05); *Y02E 10/40* (2013.01); *Y02E 10/52* (2013.01)

(58) Field of Classification Search
USPC ................... 60/641.8–641.15; 126/685–687
See application file for complete search history.

(56) References Cited

U.S. PATENT DOCUMENTS

| | | | | |
|---|---|---|---|---|
| 4,823,772 | A * | 4/1989 | Lenz | F03G 6/065 126/602 |
| 6,620,995 | B2 * | 9/2003 | Vasylyev | F24S 23/70 136/246 |
| 8,767,302 | B2 * | 7/2014 | Whang | G02B 19/0028 126/683 |
| 9,739,991 | B2 * | 8/2017 | Delsaut | H01L 31/0547 |
| 9,772,121 | B1 * | 9/2017 | Al-Maaitah | F24S 23/71 |
| 2002/0075579 | A1 * | 6/2002 | Vasylyev | G02B 5/10 359/853 |
| 2002/0139414 | A1 * | 10/2002 | Vasylyev | F24S 23/70 136/246 |
| 2014/0251308 | A1 * | 9/2014 | Wyle | F24S 23/71 126/600 |

* cited by examiner

SYSTEM FOR COLLECTING RADIANT ENERGY WITH A NON-IMAGING SOLAR CONCENTRATOR

CROSS REFERENCE TO RELATED APPLICATION

This application claims the benefit of U.S. patent application Ser. No. 62/535,784, which was filed on Jul. 21, 2017, and is incorporated herein by reference in its entirety.

TECHNICAL FIELD

This disclosure relates to implementations of a system for collecting radiant energy with a non-imaging solar concentrator.

BACKGROUND

Generating a high concentration ratio of solar radiation at a fixed focal point is useful for a variety of applications. A point concentrator can generate a higher concentration ratio of solar radiation than a linear concentrator. Two commercially known point concentrators are solar power tower systems and parabolic dish systems. Solar power tower systems rely on an array of dual-axis tracking reflectors (heliostats) that concentrate sunlight on a central receiver atop a tower. As a result of Incident Angle Modification (IAM), solar power towers have the disadvantage of low optical solar efficiency. Furthermore, the position of the receiver atop the tower makes it difficult to maintain. Alternatively, parabolic dish systems have a high optical solar efficiency due to an IAM that is up to 1.0. Commercially known parabolic dish systems have the disadvantage of a moving focal point and a high wind load that limits the size of the dish to around 10 meters in diameter. Furthermore, the elevated position of the receiver, between the dish and the sun, makes it difficult to reach and maintain.

There are existing concentrators (also referred to as lower focal point concentrators) that are configured to focus solar radiation to a focal point located thereunder, opposite the sun. Examples include refractive lenses, either smooth imaging lenses or Fresnel type transparent lenses. However, producing large glass or plastic lenses is often not practical and/or cost prohibitive. Furthermore, the wind load of such lenses limits their size to less than 10 meters in diameter. Any larger and the lens can be easily broken.

U.S. Pat. No. 6,620,995 ("'995 patent") discloses another example lower focal point concentrator that is configured to focus solar radiation to a focal point located thereunder, the center of the focal point is fixed with respect to the ground. However, the '995 patent describes a concentrator where the reflector rings all have the same width resulting in an un-even concentration ratio of solar energy at the focal point. Further, the reflective surface of each reflector ring is concave. Still further, the '995 patent does not disclose a suitable tracking apparatus for use with the disclosed concentrator.

Once a nonmoving focal point (or area) for solar radiation has been formed by a concentrator, the heat generated at the focal point may have many applications. For example, the heat generated at the focal point may be used to heat an energy receiver configured to act as the melting pot of a metal smelter. The heat generated at the focal point may be used to heat up a hot air receiver operably connected to a Brayton cycle gas turbine which may be the first part of a combined cycle gas turbine system. At this time, combined cycle gas turbine systems have the highest thermal to electrical efficiency known to those of ordinary skill in the art. Furthermore, a thermolysis device, or a portion thereof, may be positioned at the focal point of the concentrator. In this way, the thermolysis device can split water into hydrogen and oxygen using the high temperatures generated at the focal point. The produced hydrogen may be reacted with atmospheric $CO_2$ to produce a variety of liquid fuels.

The present invention discloses a system configured to track the sun and focus radiant energy (i.e., sunbeams) striking a non-imaging concentrator onto a receiver positioned thereunder. The system disclosed herein provides ring-like reflective elements, each ring-like reflective element includes a reflective surface having a unique width, that are configured to evenly concentrate the Sun's radiant energy across the entire diameter of the focal point (or area) of the concentrator. The non-imaging concentrator of the present disclosure can be made of a reflective metal, or another suitable reflective material, and is configured to allow wind to flow through the ring-like reflective elements thereof. As such, the non-imaging concentrator is not limited to a maximum diameter of ~10 meters making it suitable for commercial applications (e.g., energy generation, metal smelting, thermolysis, etc.).

SUMMARY OF THE INVENTION

Implementations of a system for collecting radiant energy with a non-imaging solar concentrator are provided. In some implementations, the system may be configured to focus radiant energy striking a plurality of concentric, conical ring-like reflective elements of the non-imaging concentrator onto a receiver positioned thereunder. In some implementations, the system may be configured to position the non-imaging concentrator so that the sun is normal thereto. In some implementations, the system may be configured to rotate and/or pivot the receiver so that at least a portion thereof is always kept within the focal point (or area) of the non-imaging concentrator. In this way, the non-imaging concentrator is able to focus radiant energy from the sun onto the receiver.

In some implementations, the system for collecting radiant energy with a non-imaging solar concentrator may comprise a tracking apparatus configured to support the non-imaging concentrator and position it so that the sun is normal thereto, and a receiver connected to a non-flexible piping system that is configured to transfer the concentrated solar energy to an absorbing system where the energy is finally utilized (e.g., a combined-cycle gas turbine system). In some implementations, the receiver, also referred to as an energy receiver, may be configured to receive and convert radiant energy to another useful type of energy (e.g., heat and/or electricity).

In some implementations, the tracking apparatus may comprise a ground-based support structure, a rotating support structure, a connecting shaft, and two support arms. In some implementations, the tracking apparatus may further comprise a motor that is used to rotate the rotating support structure which is positioned on the ground-based support structure.

In some implementations, the two support arms may be rotatably connected to opposite sides of the rotating support structure. In some implementations, a motor may be used to rotatably connect each support arm to the rotating support structure. In this way, the motors may be used to rotate the support arms of the tracking apparatus about a horizontal axis. In some implementations, a counterweight may be positioned on a first end of each support arm and used to counterbalance the weight of the non-imaging concentrator secured to the second end thereof.

In some implementations, the two support arms may be configured so that the center of the non-imaging concentrator's focal point (or area) is fixed with respect to the ground. This is achievable by making the distance between where the support arms contact an outer edge of the non-imaging concentrator and the pivot point of the two support arms the same as the focal length of the non-imaging concentrator, wherein the focal length is the vertical distance between the center of the reflective surface of the outer most ring-like reflective element and the center of the focal point (or area).

In some implementations, the connecting shaft may extend between the two motors of the support arms and be operably connected to the receiver. In this way, the rotation of the receiver is tied to the rotational movement of the support arms supporting the non-imaging concentrator. In some implementations, the connecting shaft may be configured to orient (e.g., rotate and/or pivot) the receiver so that it is always facing a bottom side of the non-imaging concentrator. In this way, at least a portion of the receiver is kept within the focal point (or area) of the non-imaging concentrator.

In some implementations, the tracking apparatus may be configured to keep the top side of the non-imaging concentrator perpendicular to the rays of the sun by rotating the support structure and adjusting the angle of the support arms. In this way, the tracking apparatus may be used to ensure that the top side of the non-imaging concentrator is tracking and facing the azimuth angle of the sun thereby allowing solar radiation from the sun to be concentrated onto the receiver by the concentrator.

In some implementations, the non-imaging concentrator may comprise a plurality of concentric, conical ring-like reflective elements having variable widths therebetween that are arranged in such a way to concentrate incoming solar radiation to a focal point (or area) positioned thereunder.

In some implementations, the inner side of each reflective element may be a reflective surface. In some implementations, each reflective element may have a unique tilt angle ($\beta$) configured to reflect incoming solar radiation to a single focal point (or area). In some implementations, each reflective element may be made of a reflective metal or another suitable reflective material.

In some implementations, provided equations may be used alone, or in conjunction with other equations disclosed herein or known to those of ordinary skill in the art, to produce a non-imaging concentrator that is configured to concentrate solar radiation evenly at a single focal point (or area) having a diameter (d).

In some implementations, the width of each ring-like reflect element and its distance from an adjacent ring-like reflective element needs to satisfy the follow three conditions:

In some implementations, the first condition requires that each ring-like reflective element be positioned so that it does not shade the reflective surface of an adjacent reflective element and leaves no gap therebetween through which any incoming sunbeams may pass. Moreover, the location of each ring-like reflective element is chosen so that it does not block the sunbeams reflected by the reflective surface of an adjacent reflective element. In this way, the reflective elements may be optimally configured to, within their combined areas, reflect all incoming solar radiation and thereby generate higher temperatures at the focal point (or area).

In some implementations, the second condition requires that the tilt angle ($\beta$) of each reflective element be set so that incoming sunbeams striking the center of the reflective surface thereof are reflected to the center O of the focal point (or area).

In some implementations, the third condition requires that the width of each reflective element result in sunbeams striking the reflective surface thereof to form a circle of concentrated sunbeams having a diameter ($d_2$) that is the same diameter ($d_1$) as the circle of concentrated sunbeams formed by the other reflective elements (i.e., $d_2=d_1=d$). In this way, the overlapping concentration of sunbeams results in a focal point (or area) having a diameter (d) suitable for heat transfer to occur that is larger than the focal point of prior art designs.

In some implementations, the receiver may be configured to pivot about a horizontal axis and rotate about a vertical axis. In this way, the receiver may be kept oriented towards the bottom side of the non-imaging concentrator while connected to a ground based energy absorbing system (e.g., a combined-cycle gas turbine system) via at least two stationary supply passages. In some implementations, the at least two stationary supply passages may comprise a combination of pipes and swivel joints.

In some implementations, the pipes and swivel joints (rotating sealed joints) of the system may be used to transfer fluids (e.g., liquids and/or gases) between the receiver and an absorbing system where the concentrated solar energy is utilized. In some implementations, the pipes may be non-flexible. In some implementations, the pipes and swivel joints may be configured to carry hot and/or pressurized fluids (e.g., liquids and gases).

In some implementations, the receiver of a system for collecting radiant energy with a non-imaging solar concentrator may be configured to receive compressed air originating from a combined cycle gas turbine system. In some implementations, the receiver, in conjunction with the non-imaging solar concentrator, may be configured to heat compressed air flowing thereto from a combined cycle gas turbine system. In this way, the receiver may be used to replace the combustion chamber of a Brayton cycle gas turbine.

In some implementations, a thermal storage system may be used in conjunction with the system configured to collect radiant energy using a non-imaging solar concentrator disclosed herein. In this way, thermal energy produced by the non-imaging concentrator during the day may be used to power a steam turbine at night. In some implementations, the thermal storage system may be positioned underneath the system configured to collect radiant energy using a non-imaging solar concentrator.

In some implementations, the receiver may be configured to act as a thermolysis device for water and thereby generate hydrogen and oxygen. In such an implementation, water may be pumped into the receiver where it is heated up, by solar radiation concentrated thereon by the non-imaging concentrator, to a temperature required to separate the hydrogen from the oxygen in the water.

In some implementations, the receiver may be configured to act as the melting pot of a metal smelter. In this way, the system may be configured to act as a solar powered smelter and/or foundry.

In some implementations, the receiver may be replaced with a Stirling engine that may be resting on the ground.

DETAILED DESCRIPTION

Figure 1:
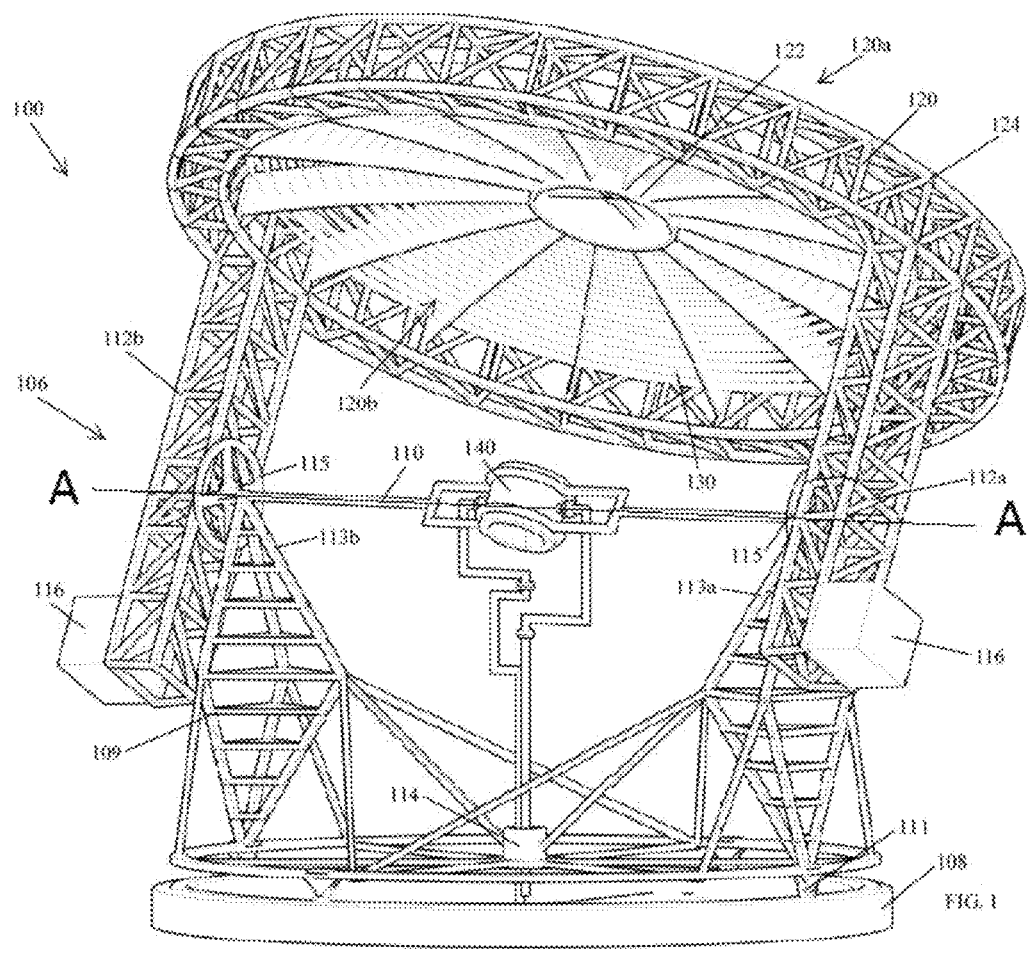
FIG. 1 illustrates a system for collecting radiant energy with a non-imaging solar concentrator constructed according to the principles of the present disclosure.

FIG. 1 illustrates a system for collecting radiant energy with a non-imaging solar concentrator 100. In some implementations, the system 100 may be configured to focus radiant energy striking a plurality of concentric, conical ring-like reflective elements 130 of the non-imaging concentrator 120 onto a receiver 140 positioned thereunder. In some implementations, the system 100 may be configured to position the non-imaging concentrator 120 so that the sun is normal thereto. In some implementations, the system 100 may be configured to rotate and/or pivot the receiver 140 so that at least a portion thereof is always kept within the focal point (or area) of the non-imaging concentrator 120. In this way, the non-imaging concentrator 120 is able to focus radiant energy from the sun onto the receiver 140.

As shown in FIG. 1, in some implementations, the system for collecting radiant energy with a non-imaging solar concentrator 100 may comprise a tracking apparatus 106 configured to support the non-imaging concentrator 120 and position it so that the sun is normal thereto, and a receiver 140 connected to a piping system that is configured to transfer the concentrated solar energy to an absorbing system where the energy is finally utilized (e.g., a combined-cycle gas turbine system). In some implementations, the receiver 140, also referred to as an energy receiver, may be configured to receive and convert radiant energy to another useful type of energy (e.g., heat and/or electricity).

As shown in FIG. 1, in some implementations, the tracking apparatus 106 may comprise a ground-based support structure 108, a rotating support structure 109, a connecting shaft 110, a first support arm 112a, and a second support arm 112b. In some implementations, the underside of the rotating support structure 109 may include wheels 111 thereon that rest within a circular guide path found on a top side of the ground-based support structure 108. In this way, the rotating support structure 109 may rotate about the bearing 114 while resting on the ground-based support structure 108. In some implementations, the tracking apparatus 106 may further comprise a motor (not shown) that is used to rotate the rotating support structure 109 positioned on the ground-based support structure 108.

In some implementations, the tracking apparatus 106 may be configured so that the support arms 112a, 112b thereof support the non-imaging concentrator 120 and position a top side 120a thereof to be perpendicular to the sun throughout the day (see, e.g., FIG. 1).

As shown in FIG. 1, in some implementations, the first support arm 112a and the second support arm 112b (collectively support arms 112) may be rotatably connected to a first side 113a and a second side 113b, respectively, of the rotating support structure 109. In some implementations, a motor 115 may be used to rotatably connect the first support arm 112a and the second support arms 112b to the first side 113a and the second side 113b, respectively, of the rotating support structure 109 (see, e.g., FIG. 1). In this way, the motors 115 may be used to rotate the support arms 112 of the tracking apparatus 106 about axis A-A. In some implementations, a counterweight 116 may be positioned on a first end of each support arm 112a, 112b and used to counterbalance the weight of the non-imaging concentrator 120 secured to the second end thereof.

Figure 3:
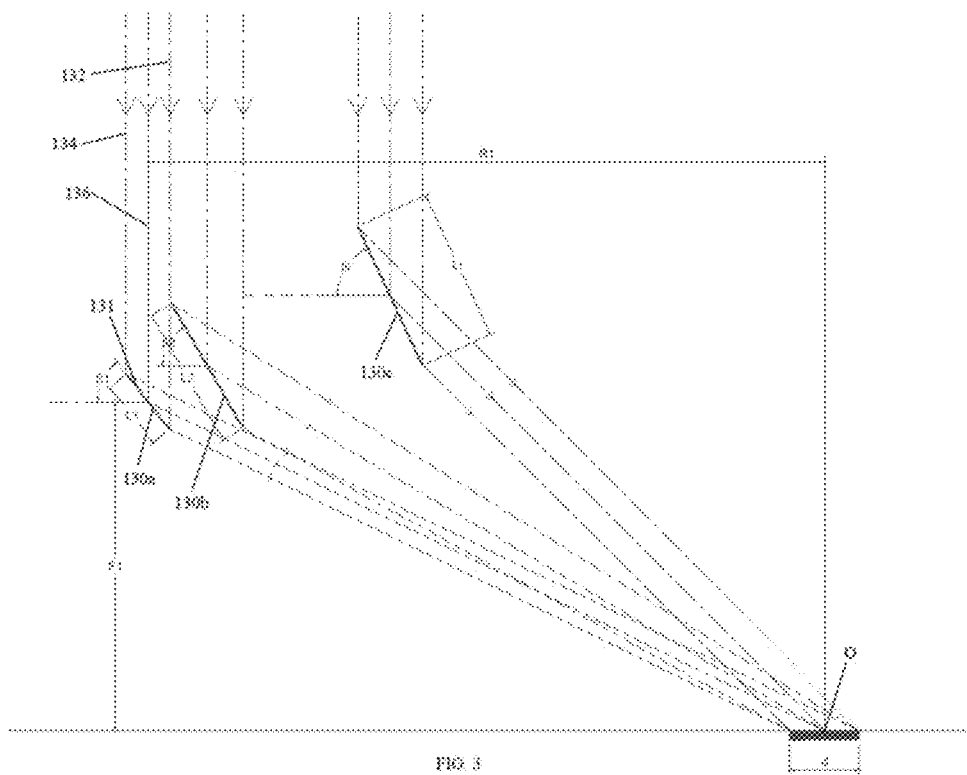
FIG. 3 illustrates a cross-sectional view of three ring-like reflective elements, wherein the sunbeams are reflected to the focal area having a diameter (d), the center of the focal area is at O.

As shown in FIGS. 1 and 3, in some implementations, the two support arms 112 may be configured so that the center O of the non-imaging concentrator's focal point (or area) is fixed with respect to the ground. This is achievable by making the distance between where the support arms 112 contact an outer edge (i.e. a portion of 124) of the non-imaging concentrator 120 and the pivot point (i.e., horizontal axis A-A) of the two support arms 112 the same as the focal length ($F_1$) of the non-imaging concentrator 120 (see, e.g., FIG. 3).

As shown in FIG. 1, in some implementations, the connecting shaft 110 may extend between the two motors 115 and be operably connected to the receiver 140. In this way, the rotation of the receiver 140 is tied to the rotational movement of the support arms 112 supporting the non-imaging concentrator 120. In some implementations, the connecting shaft 110 may be configured to orient (e.g., rotate and/or pivot) the receiver 140 so that it is always facing a bottom side 120b of the non-imaging concentrator 120. In this way, at least a portion of the receiver 140 is kept within the focal point (or area) of the non-imaging concentrator 120.

Figure 4A:
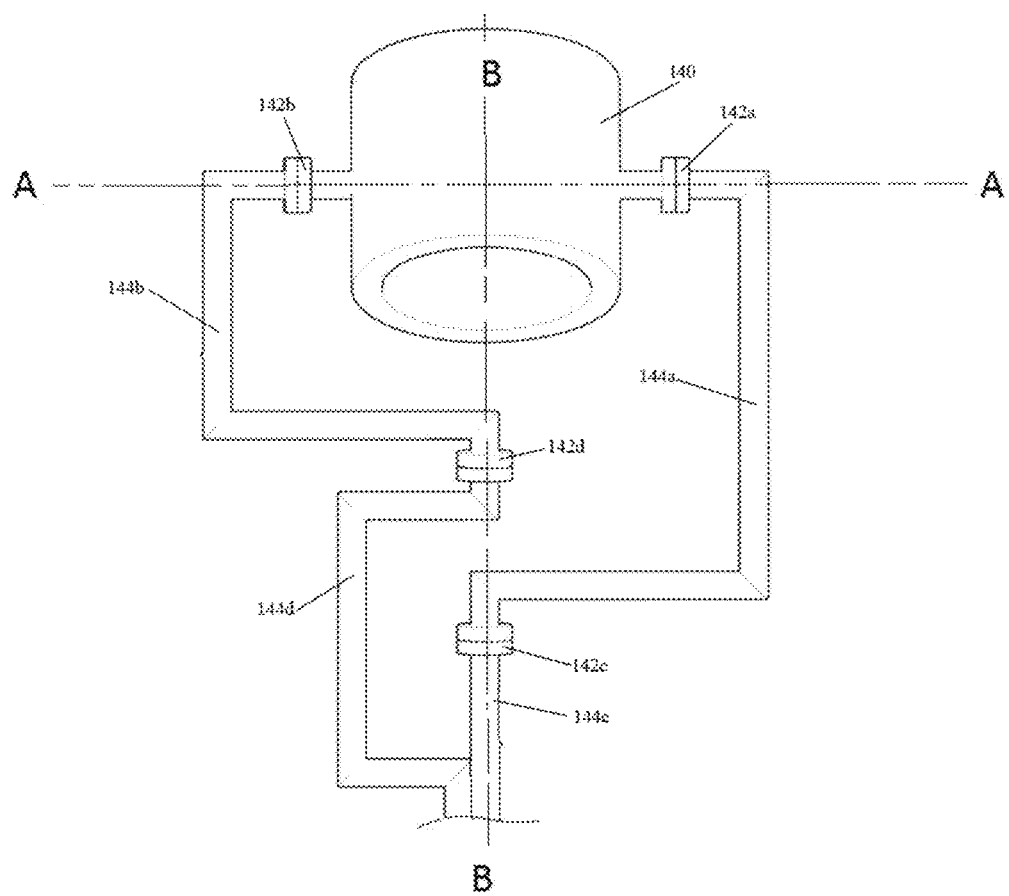
FIG. 4A illustrates a receiver connected to the pipes and swivel joints of the stationary supply passages, wherein the receiver pivots about axis A-A and rotates about axis B-B.
Figure 4B:
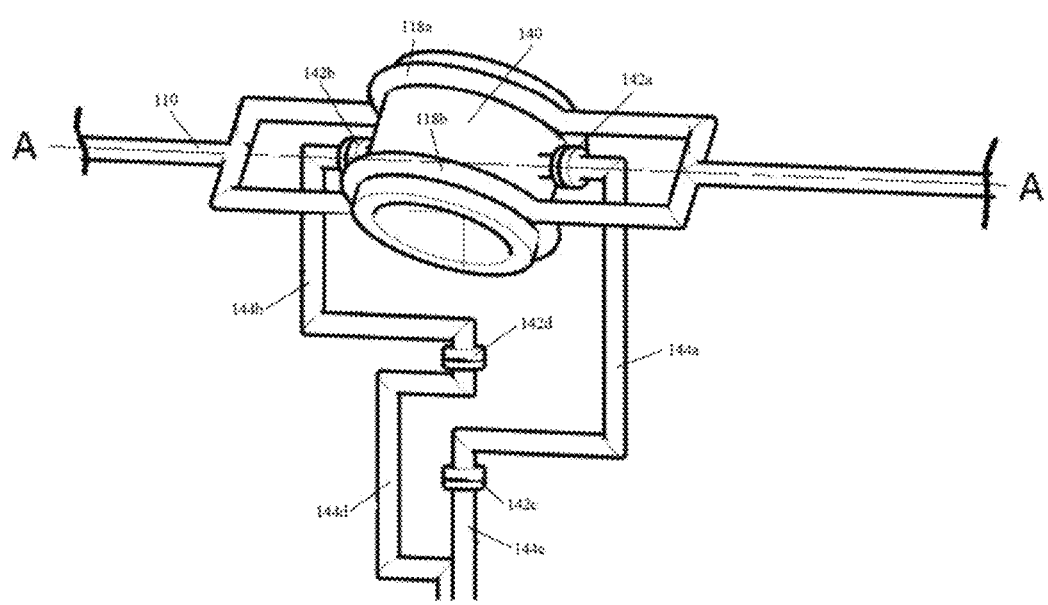
FIG. 4B illustrates the receiver of FIG. 4A with the connecting shaft operably connected thereto.

As shown in FIG. 4B, in some implementations, the connecting shaft 110 may include a first holding ring 118a and a second holding ring 118b configured to secure about an exterior of the receiver 140 of the system 100. In this way, the receiver 140 may be operably connected to the connecting shaft 110.

In some implementations, the tracking apparatus 106 may be able to keep the top side 120a of the non-imaging concentrator 120 perpendicular to incoming sunbeams by rotating the support structure 109 and adjusting the angle of the support arms 112. In this way, the tracking apparatus 106 may be used to ensure that the top side 120a of the non-imaging concentrator 120 is tracking and facing the azimuth angle of the sun thereby allowing solar radiation from the sun to be concentrated onto the receiver 140 by the concentrator 120.

Figure 2A:
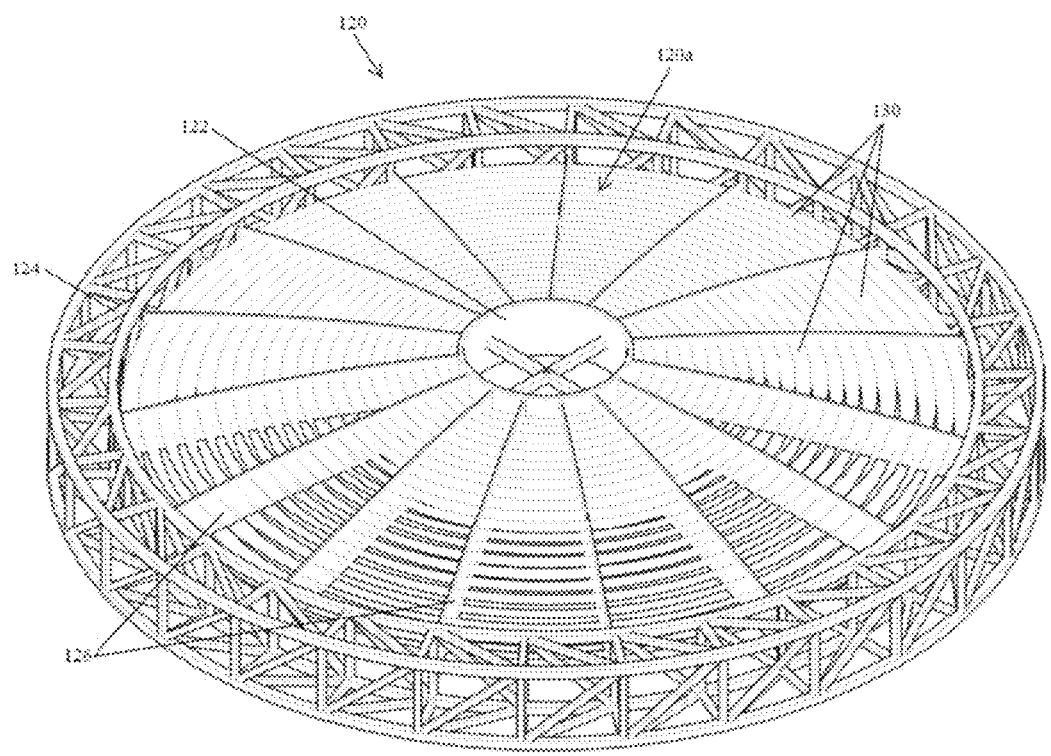
FIG. 2A illustrates a non-imaging solar concentrator constructed according to the principles of the present disclosure.
Figure 2B:
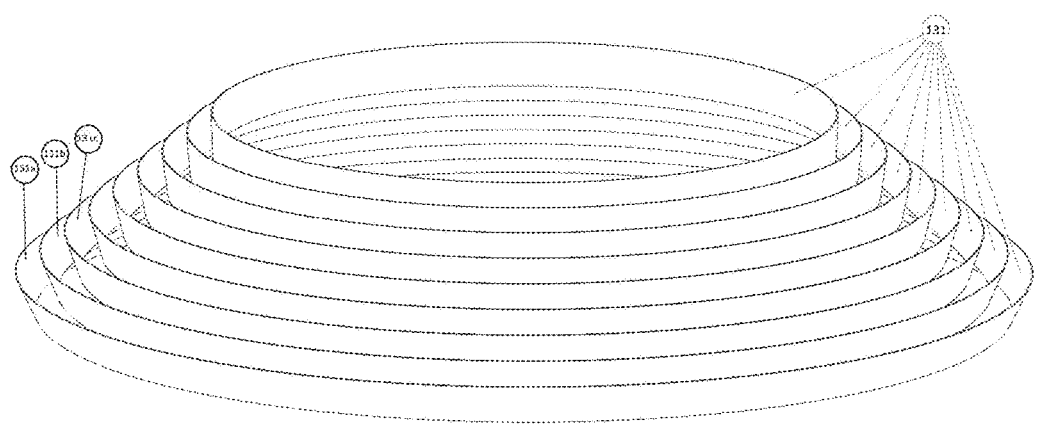
FIG. 2B illustrates the plurality of nested, concentric, conical ring-like reflective elements of the non-imaging solar concentrator shown in FIG. 2A.

As shown in FIGS. 2A and 2B, in some implementations, the non-imaging concentrator 120 may comprise a plurality of concentric, conical ring-like reflective elements 130 having variable widths therebetween that are arranged in such a way to concentrate incoming solar radiation to a focal point (or area), having a diameter (d), positioned thereunder. In some implementations, the non-imaging concentrator 120 may further comprise a plurality of ribs 126 that extend between an inner rim 122 and an outer rim 124 thereof. In some implementations, the focal point (or area) underneath the non-imaging concentrator 120 may be centrally positioned relative to the ring-like reflective elements 130 thereof (see, e.g., FIGS. 1 and 3).

In some implementations, the ribs 126 of the non-imaging concentrator 120 may be configured to hold the reflective elements 130 in place thereby preserving the distance between each reflective element 130 and the tilt angle (β) thereof (see, e.g., FIG. 3).

In some implementations, the support arms 112 of the tracking apparatus 106 may be secured to the outer rim 124 of the non-imaging concentrator 120. In some implementations, the support arms 112 of the tracking apparatus 106 may be secured to the outer rim 124 of the non-imaging concentrator 120 using any suitable method known to one of ordinary skill in the art.

As shown in FIGS. 2B and 3, in some implementations, the inner side 131 of each reflective element 130 may be a reflective surface. In some implementations, each reflective element 130 may have a unique tilt angle (β) configured to reflect incoming solar radiation to a single focal point (or area). In some implementations, each reflective element 130 may be made of a reflective metal or another suitable reflective material.

In some implementations, the following equations may be used alone, or in conjunction with other formulas disclosed herein or known to those of ordinary skill in the art, to design a non-imaging concentrator 120 that is configured to concentrate solar radiation evenly at a single focal point (or area) having a diameter (d). In this section, it is assumed that the top side 120a of the non-imaging concentrator 120 is normal to the sun, in the exact meridian position. Put another way, the disclosed tilt angle (β) of each reflective element 130 (e.g., 130a, 130b, 130c) remains the same as long as the incoming sunbeams 132 are normal to the top side 120a of the non-imaging concentrator 120 (see, e.g., FIGS. 1 and 2A). Succinctly put, the configuration (e.g., tilt angle (β)) of each reflective element 130 remains unchanged as long as the top surface 120a of the solar concentrator 120 is kept perpendicular to the sun by the tracking apparatus 106 of the system 100 during use.

In some implementations, the first reflective element 130a should have a width that satisfies the following relationship:

$$L_1 = d_1 \operatorname{Sin}(2\beta_1 - \pi/2)/\operatorname{Cos}(\beta_1)$$

Wherein:

$L_1$=the width of the first reflective element 130a;

$\beta_1$=the tilt angle of the reflective surface 131 of the first reflective element 130a relative to the incoming sunbeam 132; and $d_1$=the diameter of the concentrated sunbeams (i.e., 132, 134, 136) reflected off the top, center, and bottom of the reflective surface 131 of the first reflective element 130a at the focal point (or area) of the non-imaging concentrator 120, the center of the focal point (or area) is O (see, e.g., FIG. 3).

As shown in FIG. 3, in some implementations, the tilt angle β1 may be set so that the first reflective element 130a will reflect an incoming sunbeam 136 striking the center of the reflective surface 131 to the center O of the focal point (or area). The center O of the focal point (or area) is located a vertical distance $F_1$ and a horizontal distance $R_1$ from the center of the reflective surface 131 of the first reflective element 130a (discussed in greater detail below).

In some implementations, as shown in FIG. 3, the tilt angle β1 of the first reflective element 130a may be set to satisfy the following relationship:

$$\beta_1 = \operatorname{arctan}(F_1/R_1)/2 + \pi/2$$

As shown in FIGS. 2B and 3, in some implementations, the second reflective element 130b is located inside the first ring-like reflective element 130a. In some implementations, the width $L_2$ of the second reflective element 130b and the distance thereof from the first reflective element 130a needs to satisfy the follow three conditions:

In some implementations, the first condition requires that the second reflective element 130b be positioned so that it does not shade the reflective surface 131 of the first reflective element 130a and leaves no gap between the two reflective elements 130a, 130b through which any incoming sunbeams may pass (see, e.g., FIG. 3). In this way, the two reflective elements 130a, 130b may be optimally configured to, within their combined areas, reflect all incoming solar radiation (e.g., 132, 134, and 136).

In some implementations, the second condition requires that the tilt angle $\beta_2$ of the second reflective element 130b be set so that incoming sunbeams striking the center of the reflective surface 131 thereof are reflected to the center O of the focal point (or area) (see, e.g., FIG. 3).

In some implementations, the third condition requires that the width $L_2$ of the second reflective element 130b result in sunbeams striking the reflective surface 131 thereof to form a circle of concentrated sunbeams having a diameter ($d_2$) that is the same diameter ($d_1$) as the circle of concentrated sunbeams formed by the first reflective element 130a (i.e., $d_2 = d_1 = d$). In this way, the overlapping concentration of sunbeams results in a focal point (or area) having a larger diameter (d) suitable for heat transfer to occur, as compared to prior art designs.

In some implementations, the second reflective element 130b should have a width that satisfies the following relationship:

$$L_2 = d_2 \operatorname{Sin}(2\beta_2 - \pi/2)/\operatorname{Cos}(\beta_2)$$

Wherein:

$L_2$=the width of the second reflective element 130b;

$\beta_2$=the tilt angle of the reflective surface 131 of the second reflective element 130b relative to the incoming sunbeam; and $d_2$=the diameter of the concentrated sunbeams reflected off of the top, center, and bottom of the reflective surface 131 of the second reflective element 130b at the focal point (or area) of the non-imaging concentrator 120, the center of the focal point (or area) is O.

A shown in FIG. 3, in some implementations, the tilt angle $\beta_2$ may be set so that the second reflective element 130b will reflect an incoming sunbeam striking the center of the reflective surface 131 to the center O of the focal point (or area). The center O of the focal point (or area) is located a vertical distance and a horizontal distance from the center of the reflective surface 131 of the second reflective element 130b. In some implementations, the tilt angle $\beta_2$ of the second reflective element 130b may be chosen using the same, or a similar, equation as is used to set the tilt angle $\beta_1$ of the first reflective element 130a.

As shown in FIGS. 2B and 3, in some implementations, the third ring-like reflective element 130c is located inside the second ring-like reflective element 130b. In some implementations, the width $L_3$ of the third reflective element 130c and the distance thereof from the second reflective element 130b needs to satisfy the three conditions set forth above in connection with the second reflective element 130b. As such, the third reflective element 130c, and subsequent reflective elements 130, should have a width that satisfies the following relationship:

$$L_i = d_i \sin(2\beta_i - \pi/2)/\cos(\beta_i)$$

Wherein:

$L_i$=the width of the third, or subsequent, reflective element 130;

$\beta_i$=the tilt angle of the reflective surface 131 of the third, or subsequent, reflective element 130 (e.g., 130c) relative to an incoming sunbeam; and $d_i$=the diameter of the concentrated sunbeams reflected off of the top, center, and bottom of the reflective surface 131 of the third, or subsequent, reflective element 130 at the focal point (or area) of the non-imaging concentrator 120, the center of the focal point (or area) is O. In some implementations, $d_i = d_2 = d_1 = d$ (see, e.g., FIG. 3).

Prior to using the above provided equations to set the width of each ring-like reflective element 130 and/or the tilt angle of the reflective surface 131 thereof, in some implementations, the diameter (d) of the focal point (or area) may be decided on.

As shown in FIG. 3, in some implementations, each ring like reflective element 130 may have a different width than the other ring like reflective elements 130 of a non-imaging concentrator 130. In some implementations, starting from the outer most ring-like reflective element 130a, the width of each ring-like element 130 may increase (see, e.g., FIG. 3).

In some implementations, as would be understood by a person of ordinary skill in the art, the above provided equations may be used in any suitable manner to configure a non-imaging concentrator 120 comprised of a plurality of ring-like reflective elements 130 configured to evenly concentrate radiant energy at a single focal point.

One advantage of the non-imaging concentrator 120 disclosed herein, as compared to the prior art, is that wind may pass through the ring-like reflective elements 130. In this way, the wind load on the non-imaging concentrator 120 and the system 100 as a whole is reduced. As a result, a non-imaging concentrator 120 using ring-like reflective elements 130 may be built to have a larger diameter than a solid concentrating lens or a parabolic dish. In this way, the non-imaging concentrator 120 may be configured to generate a focal area, the center of which is at point O, having a higher temperature than other solar concentrating devices (e.g., point concentrators).

As shown in FIG. 1, in some implementations, at least a portion of the receiver 140 may be positioned to coincide with the focal point (or area) of the non-imaging concentrator 120.

As shown in FIGS. 1, 4A, and 4B, in some implementations, the receiver 140 may be configured to pivot about axis A-A and rotate about axis B-B. In this way, the receiver 140 may be kept oriented towards the bottom side of the non-imaging concentrator 120 while connected to a ground based energy absorbing system (e.g., a combined-cycle gas turbine system 500) via at least two stationary supply passages. In some implementations, the at least two stationary supply passages may comprise a combination of pipes 144 and swivel joints 142 (discussed in detail below).

As shown in FIGS. 4A and 4B, in some implementations, the system 100 may further comprise four pipes 144 and four swivel joints 142 (rotating sealed joints) that may be used to transfer fluids (e.g., liquids and/or gases) into and out of the connected receiver 140. In some implementations, the pipes 144 may be non-flexible. In some implementations, the pipes 144 and swivel joints 142 may be configured to carry hot and/or pressurized fluids (e.g., liquids and gases).

As shown in FIG. 4A, in some implementations, a first end of the first pipe 144a may be connected to a first side of the receiver 140 by a first swivel joint 142a and a first end of the second pipe 142b may be connected to a second side of the receiver 140 by a second swivel joint 142b. In some implementations, the first swivel joint 142a and the second swivel joint 142b may be in coaxial alignment thereby allowing the receiver 140 to pivot about axis A-A as shown in FIG. 4A. In this way, the receiver 140 may be rotated by the connecting shaft 110 to stay oriented towards the bottom side 120b of the concentrator 120 while it follows the tilt angle of the sun (see, e.g., FIGS. 1 and 4B).

As shown in FIG. 4A, in some implementations, a second end of the first pipe 144a may be connected to a first end of the third pipe 142c by a third swivel joint 142c and a second end of the second pipe 144b may be connected to a first end of the fourth pipe 142d by a fourth swivel joint 142d. In some implementations, the third swivel joint 142c and the fourth swivel joint 142d may be in coaxial alignment thereby allowing the receiver 140 to rotate about axis B-B as shown in FIG. 4A. In this way, when the support structure 109 rotates so that the concentrator 120 can follow the azimuth angle of the sun, the connecting shaft 110 is able to rotate the receiver 140 connected to the stationary supply passages (e.g., pipes 144c, 144d) about axis B-B while it is also being kept oriented towards the bottom side 120b of the concentrator 120.

As shown in FIG. 4B, in some implementations, the first and second swivel joints 142a, 142b may be in coaxial alignment with the connecting shaft 110 of the tracking apparatus 106.

As shown in FIG. 4B, in some implementations, the weight of the receiver 140 may be primarily carried by the connecting shaft 110 of the tracking apparatus 106. In some implementations, none of, or a minimal amount of, the weight of the receiver 140 is supported by the pipes 144 and/or swivel joints 142.

Figure 5:
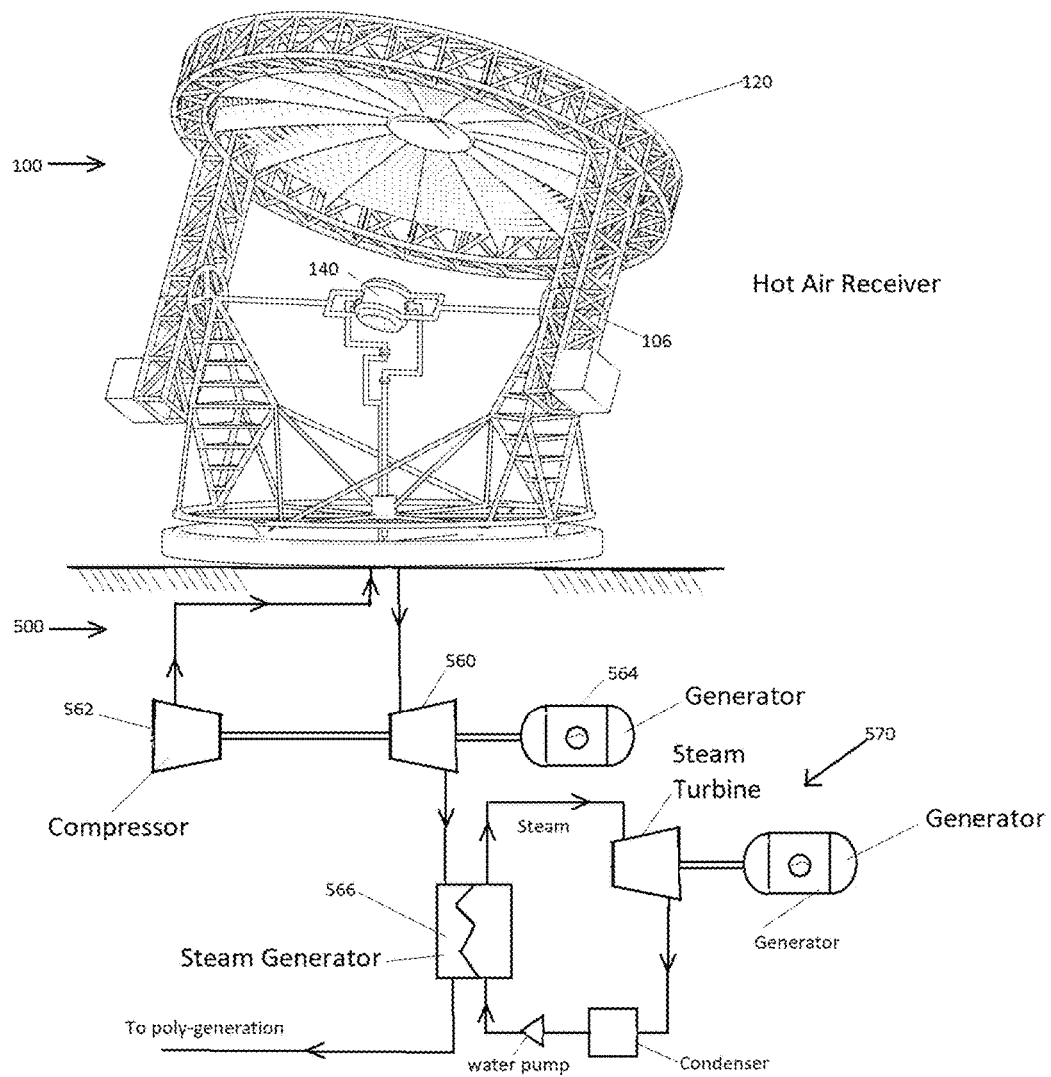
FIG. 5 illustrates the system for collecting radiant energy with a non-imaging solar concentrator being used in conjunction with a combined cycle gas turbine system in accordance with the principles of the present disclosure.
Figure 6A:
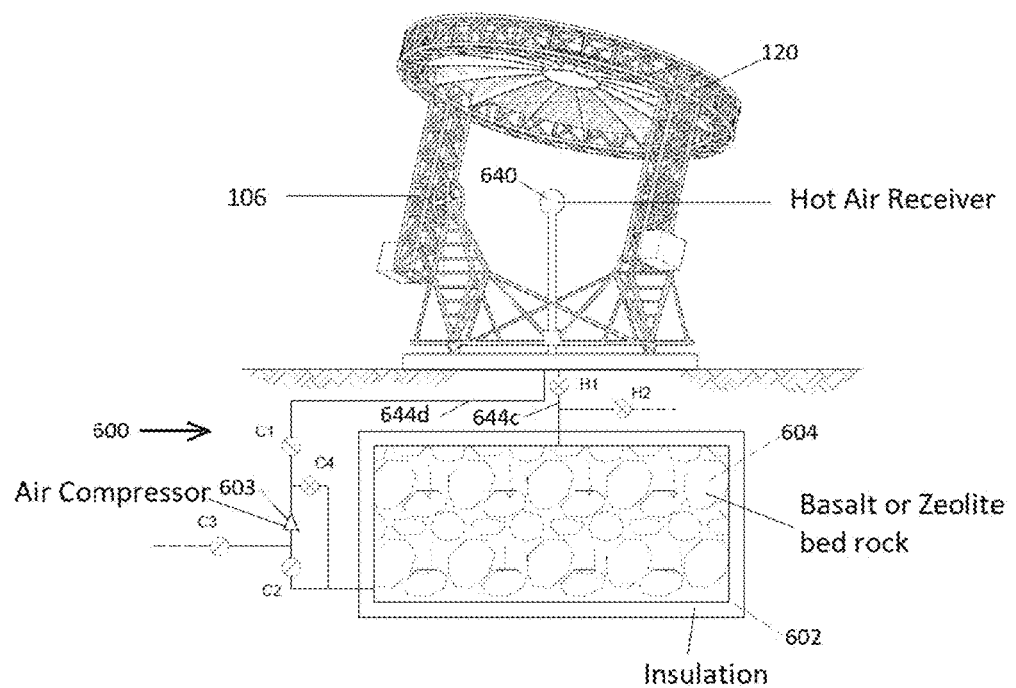
FIG. 6A illustrates the system for collecting radiant energy with a non-imaging solar concentrator being used in conjunction with a thermal storage system.
Figure 6B:
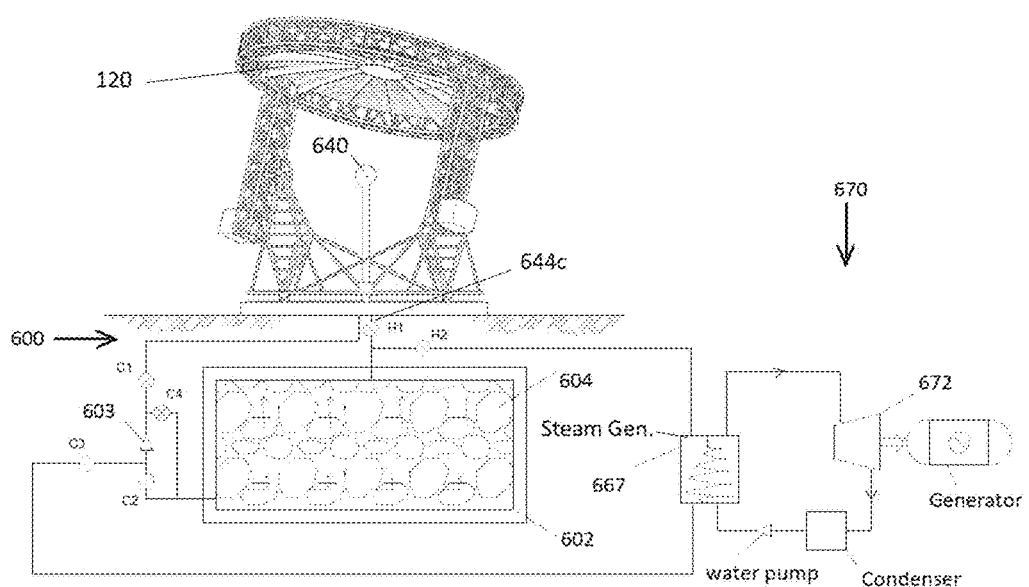
FIG. 6B illustrates the system for collecting radiant energy with a non-imaging solar concentrator and the thermal storage system of FIG. 6A being used in conjunction with a steam turbine.

One advantage of connecting the receiver 140 to the stationary supply passages (i.e., pipes 144c, 144d) using the first and second pipes 144a, 144b and the swivel joints 142 is that hot and/or pressurized fluids can be transferred into and out of the receiver 140 to a ground based energy absorbing system without using a flexible piping system (see, e.g., FIGS. 5, 6A, and 6B).

As shown in FIG. 5, in some implementations, the receiver 140 of a system for collecting radiant energy with a non-imaging solar concentrator 100 may be configured to receive compressed air originating from a combined cycle gas turbine system 500 that includes a compressor 562. In some implementations, the receiver 140 may be configured to heat compressed air flowing thereto from a combined cycle gas turbine system 500. In this way, the receiver 140 may be used to replace the combustion chamber of a Brayton cycle gas turbine. In some implementations, solar radiation that has been reflected and concentrated by the non-imaging concentrator 120 may be used to heat the receiver 140 and thereby the air contained therein. In some implementations, heated and/or compressed air travels (or flows) from the receiver 140 to the inlet of the gas turbine 560 shown in FIG. 5.

As a first stage, in some implementations, heated and/or compressed air flowing from the receiver 140 may cause the gas turbine 560 to rotate an electrical generator 564 and thereby generate electricity.

As a second stage, in some implementations, exhaust air from the gas turbine 560 may be blown through a heat exchanger 566 to generate steam. In some implementations, this steam may be used as part of a steam turbine system 570 to generate electricity.

In general, a receiver 140 configured to act as a hot air receiver is highly efficient at converting solar energy to thermal energy thereby allowing the combination of systems 100, 500 to be highly efficient at converting solar radiation to electrical power.

As shown in FIGS. 6A and 6B, in some implementations, a thermal storage system 600 may be used in conjunction with a system configured to collect radiant energy using a solar concentrator (e.g., system 100). In this way, thermal energy produced by a concentrator (e.g., a non-imaging concentrator 120) during the day may be used to power a steam turbine 672 (see, e.g., FIG. 6B). In some implementations, the thermal storage system 600 may be positioned underneath the system configured to collect radiant energy using a solar concentrator (e.g., system 100) being used therewith (see, e.g., FIG. 6A).

As shown in FIG. 6A, in some implementations, the thermal storage system 600 may comprise an insulted container 602 having a high thermal mass that is configured to contain a zeolite, basalt, and/or any other solid material having a high thermal mass that can remain solid at a temperature of 700° C. or higher. In some implementations, a first stationary supply passage (e.g., a pipe 664c) and a second stationary supply passage (e.g., a pipe 664d) may be used to carry hot air and cold air, respectively, from and to the hot air receiver 640, which may be a simple spherical receiver (see, e.g., FIG. 6A).

As shown in FIG. 6A, during the day, in some implementations, valves H2, C3, and C4 are closed while valves H1, C1, and C2 are open. In some implementation, an air compressor 603 pulls cool air from the insulated container 602 and pushes it into the receiver 640 to be heated therein while at the same time pulling heated air from the receiver 640 into the insulated container 602 to thereby heat the solid material contained therein and store thermal energy. In some implementations, this process continues throughout the day, for as long as the concentrator 120 can focus solar radiation onto the receiver 640.

FIG. 6B illustrates how the thermal energy stored by the solid material 604 contained within the insulated container 602 may be used to power the steam turbine 672 of a steam turbine system (e.g., 570 and/or 670).

As shown in FIG. 6B, during the night, in some implementations, valves H1, C1, and C2 are closed while valves H2, C3, and C4 are open. In some implementations, the air compressor 603 draws hot air from the insulated container 602 through the heat exchanger 667 to generate steam. In some implementations, the steam generated by the heat exchanger 667 may be used to power the steam turbine 672 operationally connected thereto. In some implementations, once the heated air has passed through the heat exchanger 667, it is pulled through the opening in valve C3 and pushed back into the insulated container 602 through the opening in valve C4 (see, e.g., FIG. 6B). In this way, the air within the system 600 may be reheated and the processes of generating steam perpetuated until there is insufficient heat trapped within the insulated container 602 to do so and/or the day begins.

In some implementations, the receiver 140 may be configured to act as a thermolysis device for water and thereby generate hydrogen and oxygen. In such an implementation, water may be pumped into the receiver 140 where it is heated up, by solar radiation concentrated by the non-imaging concentrator 120, to a temperature required to separate the hydrogen from the oxygen in the water. The temperature required to cause the thermolysis of water exceeds 800° C., a temperature easily reached if at least a portion of the receiver 114 is located within the focal area of the concentrator 120.

In some implementations, the receiver 140 may be configured to act as the melting pot of a metal smelter. In this way, the system 100 may be configured to act as a solar powered smelter and/or foundry. In such an implementation, metal ore may be moved into the receiver 140 via a conveyer belt while the liquid metal may be drained therefrom through an appropriately configured conduit.

In some implementations, the receiver 140 may be a portion of a Stirling engine that may be resting on the ground. In this way, the Stirling engine used may be much larger than those used with a parabolic dish. This is because the wind load of the parabolic dish limits its size and thereby the size of Stirling engine it is able to power. In some implementations, the Stirling engine used as part of a system 100 may be water cooled thereby increasing the output efficiency thereof.

Reference throughout this specification to "an embodiment" or "implementation" or words of similar import means that a particular described feature, structure, or characteristic is included in at least one embodiment of the present invention. Thus, the phrase "in some implementations" or a phrase of similar import in various places throughout this specification does not necessarily refer to the same embodiment.

Many modifications and other embodiments of the inventions set forth herein will come to mind to one skilled in the art to which these inventions pertain having the benefit of the teachings presented in the foregoing descriptions and the associated drawings.

The described features, structures, or characteristics may be combined in any suitable manner in one or more embodiments. In the above description, numerous specific details are provided for a thorough understanding of embodiments of the invention. One skilled in the relevant art will recognize, however, that embodiments of the invention can be practiced without one or more of the specific details, or with other methods, components, materials, etc. In other instances, well-known structures, materials, or operations may not be shown or described in detail.

While operations are depicted in the drawings in a particular order, this should not be understood as requiring that such operations be performed in the particular order shown, or in sequential order, or that all illustrated operations be performed, to achieve desirable results.

The invention claimed is:

1. A system for collecting radiant energy comprising:
a non-imaging solar concentrator, the solar concentrator comprises a plurality of nested, concentric, conical ring-like reflective elements that are arranged to evenly concentrate incoming solar radiation to a single focal area, each ring-like reflective element has a tilt angle, a width, and includes a reflective surface on an interior side thereof;
a receiver configured to be heated by the radiant energy focused thereon by the solar concentrator, the receiver is configured so that at least a portion thereof is always positioned to coincide with the focal area of the solar concentrator; and a tracking apparatus configured to support the solar concentrator and position it so that a top side thereof is perpendicular to the sun;

wherein, while the top side of the solar concentrator is positioned perpendicular to the sun, each ring-like reflective element is positioned to not shade the reflective surface of a ring-like reflective element positioned adjacent thereto, to not block sunbeams reflected by the adjacent ring-like reflective element, and to leave no gap therebetween through which any incoming sunbeams may pass without being reflected;

wherein the tilt angle of each ring-like reflective element is set so that incoming sunbeams striking a center of the reflective surface thereof are reflected to a center of the single focal area; and wherein the width of each ring-like reflective element causes incoming sunbeams striking the reflective surface thereof to form a circle of concentrated sunbeams having a diameter, the plurality of ring-like reflective elements form overlapping circles of concentrated sunbeams having the same diameter.

2. The system for collecting radiant energy of claim 1, further comprising two supply passages configured to transfer fluids between the receiver and a connected absorbing system where thermal energy generated by the receiver as a result of the radiant energy focused thereon by the solar concentrator is utilized.

3. The system for collecting radiant energy of claim 1, wherein the receiver is configured to pivot about a horizontal axis and rotate about a vertical axis; and wherein the center of the single focal area is fixed with respect to the ground.

4. The system for collecting radiant energy of claim 3, further comprising four non-flexible pipes and four swivel joints configured to transfer fluids into and out of the receiver, wherein a first end of a first pipe may be connected to a first side of the receiver by a first swivel joint and a first end of a second pipe may be connected to a second side of the receiver by a second swivel joint, the first swivel joint and the second swivel joint may be in coaxial alignment thereby allowing the receiver to pivot about the horizontal axis.

5. The system for collecting radiant energy of claim 4, wherein a second end of the first pipe may be connected to a first end of a third pipe by a third swivel joint and a second end of the second pipe may be connected to a first end of a fourth pipe by a fourth swivel joint, the third swivel joint and the fourth swivel joint may be in coaxial alignment thereby allowing the receiver to rotate about the vertical axis.

6. The system for collecting radiant energy of claim 1, wherein the tracking apparatus comprises a connecting shaft and two support arms, the connecting shaft is operably connected to the receiver and the two support arms are configured to support the solar concentrator therebetween; wherein rotational movement of the receiver about a horizontal axis is tied to the rotational movement of the connecting shaft and the two support arms of the tracking apparatus.

7. The system for collecting radiant energy of claim 6, wherein there is a first vertical distance between where each of the support arms contacts an outer edge of the solar concentrator and the horizonal axis of the tracking apparatus and a second vertical distance between the center of the reflective surface of an outermost ring-like reflective element and the center of the single focal area, the first vertical distance and the second vertical distance are equal thereby causing the focal area of the solar concentrator to be fixed with respect to a surface on which the tracking apparatus is resting.

8. The system for collecting radiant energy of claim 6, wherein the connecting shaft includes a first holding ring and a second holding ring, each holding ring is configured to secure about an exterior of the receiver.

9. The system for collecting radiant energy of claim 6, wherein the tracking apparatus further comprises a ground-based support structure and a rotating support structure, the rotating support structure is configured to rotate on a top side of the ground-based support structure and thereby rotate the solar concentrator supported between the two support arms.

10. The system for collecting radiant energy of claim 1, wherein the tracking apparatus comprises a ground-based support structure and a rotating support structure, the rotating support structure is configured to rotate on a top side of the ground-based support structure and thereby rotate the solar concentrator supported by the tracking apparatus.

11. The system for collecting radiant energy of claim 1, wherein the non-imaging solar concentrator further comprises a plurality of ribs that extend between an inner rim and an outer rim thereof, the plurality of ribs are configured to hold the plurality of ring-like reflective elements in place thereby preserving the distance between each ring-like reflective element and the tilt angle thereof.

12. The system for collecting radiant energy of claim 1, wherein the receiver is configured to heat air flowing thereto from a combined cycle gas turbine system, the heated air is utilized by the combined cycle gas turbine system to generate electricity.

13. The system for collecting radiant energy of claim 1, further comprising a thermal storage system, the thermal storage system is configured to store thermal energy generated by the receiver as a result of the radiant energy focused thereon by the solar concentrator.

14. The system for collecting radiant energy of claim 13, wherein the thermal energy stored by the thermal storage system is used to power a steam turbine operably connected thereto, the steam turbine is configured to generate electricity.

15. The system for collecting radiant energy of claim 1, wherein the receiver is configured to act as a thermolysis device for water and can be used to generate hydrogen and oxygen from water.

16. The system for collecting radiant energy of claim 1, wherein the receiver is configured to act as a melting pot of a metal smelter.

17. The system for collecting radiant energy of claim 1, wherein the receiver is a portion of a Stirling engine that is resting on the ground.

18. The system for collecting radiant energy of claim 1, wherein the width of a first ring-like reflective element satisfies the following relationship, $$L_1 = d1\ \text{Sin}(2\beta_1 - \pi/2)/\text{Cos}(\beta_1), \text{wherein:}$$

$L_1$=width of the first ring-like reflective element;
$\beta_1$=tilt angle of the reflective surface of the first ring-like reflective element; and
$d_1$=diameter of the concentrated sunbeams reflected off the reflective surface of the first reflective element at the focal area of the solar concentrator;
wherein the tilt angle of the first reflective element satisfies the following relationship, $$\beta_1 = \text{arctan}(F_1/R_1)/2 + \pi/2, \text{wherein:}$$

$F_1$=vertical distance between the center of the single focal area and the center of the reflective surface of the first ring-like reflective element;

$R_1$=horizontal distance between the center of the single focal area and the center wherein a diameter of the single focal area is equal to the diameter di of the concentrated sunbeams reflected off of the first ring-like reflective element.

19. A non-imaging solar concentrator comprising:

a plurality of nested, concentric, conical ring-like reflective elements that are arranged to evenly concentrate incoming solar radiation to a single focal area, each ring-like reflective element has a tilt angle, a width, and includes a reflective surface on an interior side thereof;

wherein, while a top side of the solar concentrator is positioned perpendicular to the sun, each ring-like reflective element is positioned to not shade the reflective surface of a ring-like reflective element positioned adjacent thereto, to not block sunbeams reflected by the adjacent ring-like reflective element, and to leave no gap therebetween through which any incoming sunbeams may pass without being reflected;

wherein the tilt angle of each ring-like reflective element is set so that incoming sunbeams striking a center of the reflective surface thereof are reflected to a center of the single focal area; and wherein the width of each ring-like reflective element causes incoming sunbeams striking the reflective surface thereof to form a circle of concentrated sunbeams having a diameter, the plurality of ring-like reflective elements form overlapping circles of concentrated sunbeams having the same diameter.

20. The non-imaging solar concentrator of claim 19, wherein the width of a first ring-like reflective element satisfies the following relationship, $$L_1 = d1\, \mathrm{Sin}(2\beta_1 - \pi/2)/\mathrm{Cos}(\beta_1), \text{ wherein:}$$

$L_1$=width of the first ring-like reflective element;

$\beta_1$=tilt angle of the reflective surface of the first ring-like reflective element; and $d_1$=diameter of the concentrated sunbeams reflected off the reflective surface of the first reflective element at the focal area of the solar concentrator; wherein the tilt angle of the first reflective element satisfies the following relationship, $$\beta_1 = \arctan(F_1/R_1)/2 + \pi/2, \text{ wherein:}$$

$F_1$=vertical distance between the center of the single focal area and the center of the reflective surface of the first ring-like reflective element;

$R_1$=horizontal distance between the center of the single focal area and the center of the reflective surface of the first ring-like reflective element; and wherein a diameter of the single focal area is equal to the diameter $d_1$ of the concentrated sunbeams reflected off of the first ring-like reflective element.

21. The non-imaging solar concentrator of claim 19, further comprises a plurality of ribs that extend between an inner rim and an outer rim of the non-imaging solar concentrator, the plurality of rib are configured to hold the plurality of ring-like reflective elements in place thereby preserving the distance between each ring-like reflective element and the tilt angle thereof.

* * * * *